United States Patent
Mohandas et al.

(10) Patent No.: US 6,768,384 B1
(45) Date of Patent: Jul. 27, 2004

(54) HIGH-SPEED DIFFERENTIAL PREAMPLIFIER

(75) Inventors: P. S. Mohandas, Bangalore (IN); Anil Agarwal, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/987,628

(22) Filed: Nov. 15, 2001

(51) Int. Cl.$^7$ .............................. H03F 3/08; H01J 40/14
(52) U.S. Cl. ......................... 330/308; 330/59; 330/10; 250/214 A
(58) Field of Search ................................ 330/110, 308; 250/214 A, 214 AG

(56) References Cited

U.S. PATENT DOCUMENTS 5,025,456 A * 6/1991 Ota et al. .................... 375/318
5,612,810 A * 3/1997 Inami et al. ............. 250/214 A
5,742,183 A * 4/1998 Kuroda ........................ 326/68

FOREIGN PATENT DOCUMENTS

| JP | 6259822 | * 3/1987 | ............ G11B/7/00 |
| JP | 2001126293 | * 5/2001 | ............ G11B/7/13 |

* cited by examiner

*Primary Examiner*—Khanh Van Nguyen

(57) ABSTRACT

A high-gain, high-speed differential preamplifier is described, in which a current source is coupled to one input of a differential amplifier and the other input of the differential amplifier is coupled to a sensor. In one implementation, the current source includes a field effect transistor operating in saturation mode and a bipolar junction transmitter in an emitter follower configuration.

15 Claims, 3 Drawing Sheets

(BACKROUND)**

HIGH-SPEED DIFFERENTIAL PREAMPLIFIER

FIELD OF THE INVENTION

The present invention relates to electronics and more particularly to a high-speed differential preamplifier.

BACKGROUND OF THE INVENTION

A preamplifier is an electronic component that is connected to a low-level signal source for providing suitable impedances and gain in an amplified signal that can be further processed without appreciable degradation in the signal-to-noise ratio. The signal source for a preamplifier can be a sensor that produces an electrical signal in response to a physical stimulus, such as light, heat, or pressure. In fiber-optic networks, the sensor can be a photodiode, which produces an electrical current in response to light. Other optical sensors include photoresistors, a device whose resistance decreases in response to a light stimulus, and a photocell, which produces an electric potential from an incidence of photons.

Preamplifiers are critical components in fiber-optic networks for controlling the noise sensitivity of optical front ends. One source of noise is known as "common mode" noise, which manifests itself as a wandering direct current (DC) bias on the input signal. To achieve a high common mode noise rejection, it is desirable to employ a differential architecture, but differentially coupling the current signal produced by a photodiode to a preamplifier is difficult without the use of external components for alternating current (AC) coupling due to the DC reverse bias required by the photodiode.

One approach for coupling a photodiode to a preamplifier is depicted in FIG. 4. A circuit 400 comprises a differential amplifier 401 that has two input nodes 403 and 405 and two output nodes 407 and 409. A feedback resistor 411 having a resistance RF is coupled between output node 407 and input node 403, and another feedback resistor 413 having a resistance RF is coupled between output node 409 and input node 405. A photodiode 415 is coupled to have a DC reverse bias between VCC and input node 405. To provide a balanced circuit, a small capacitor 417 is coupled between the input node 403 and VCC.

In this architecture, the photodiode 415 produces a signal current IS that is single-ended DC coupled to the differential amplifier 401. The differential amplifier 401 produces an inverted voltage –DV at output node 407 and a non-inverted voltage DV at output node 409 based on a difference in the electrical signal at nodes 403 and 405. The small capacitor 417 absorbs such little charge that the inverted voltage –DV at output node 407 is also present at input node 403.

In the normal operation of the differential amplifier 401, input node 405 also has a voltage of –DV, which causes the potential difference across the feedback resistor 413 to be DV–DV=2 DV. By Ohm's law, the potential difference across the feedback resistor 413 equals the product of the signal current IS flowing from photodiode 415 and the feedback resistance RF: IS×RF=2 DV, or DV=IS×RF/2. Accordingly, the single ended swing is RF/2 and the differential transimpedance gain is only RF. This gain limits the responsivity of the preamplifier in response to small input signals.

Attempting to improve the limited gain of the circuit 400 by increasing the values of the feedback resistors 411 and 41 or the capacitor 417 impairs other desirable characteristics of the circuit 400. For example, using either larger feedback resistors 411 and 41 or a larger capacitor 417 increases RC (resistance×capacitance) constant, which degrades the preamplifier's bandwidth and dynamic range. Furthermore, this and many other approaches to increasing the preamplifier's gain have been known to appreciably increase the power consumption and enlarge the integrated circuit real estate of preamplifier implementations.

SUMMARY OF THE INVENTION

A need therefore exists for a high-gain preamplifier, preferably without penalizing the preamplifier's bandwidth or consuming significantly additional power or chip area. This need as well as others, is addressed by providing a current source at one amplifier input, which allows the signal current at the other input to flow through both feedback resistors, thereby doubling the gain. Bandwidth and dynamic range is preserved because the capacitance and resistance of the circuit remain the same.

Accordingly, one aspect pertains to a circuit for amplifying a signal from a sensor, which comprises a current source and a differential amplifier with one input coupled to the sensor and another input coupled to the current source. Feedback resistors may be coupled between the inputs and respective output, such that the gain of the amplifying circuit is approximately twice the feedback resistance. The current source may be configured to source a current greater than the current produced by the sensor and, in one implementation, include a field-effect transistor in saturation mode coupled to an emitter of a bipolar junction transistor. The amplifying circuit is part of an optical front, in which the sensor includes a photodiode and is coupled to a post amplifier.

Another aspect relates to a method for amplifying a signal from a sensor. A current generated by the sensor is received at a first node, while sinking, at a second node, a current greater than the current generated by the sensor. The signal is differentially amplified based on signals at the first node and the second node.

Still other aspects, features, and advantages are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A circuit, method, and system for high-speed differential amplification are described In the following description, for the purposes of explanation, numerous specific details are set forth in order to provide a thorough understanding of the present invention It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
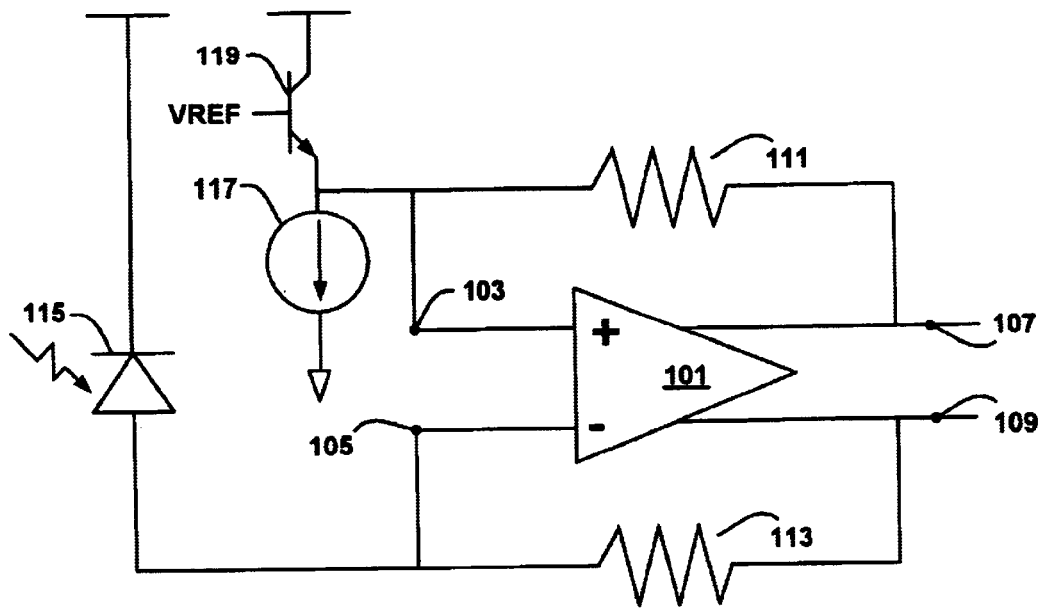
FIG. 1 depicts a high-speed, differential preamplifier in accordance with one embodiment.

A high-speed, differential preamplifier in accordance with one embodiment is depicted in FIG. 1 as circuit 100. The circuit 100 includes a differential amplifier 101 that has two input nodes 103 and 105 and two output nodes 107 and 109. A feedback resistor 111 having a resistance RF is coupled between the output node 107 and the input node 103, and another feedback resistor 113 having a resistance RF is coupled between the output node 109 and the input node 105. A photodiode 115 is coupled to have a DC reverse bias between VCC and the input node 105.

A constant current source 117, moreover, is coupled between the input node 103 and ground. The constant current source 117 is configured to sink to ground at least as much current from the input node 103 as the maximum signal current IS produced by the photodiode 115 in response to light and returned through the feedback resistor 111.

In addition, a bipolar junction transistor (BJT) 119 is provided in an emitter follower configuration with a base coupled to a reference voltage VREF, a collector coupled to source voltage VCC, and an emitter coupled to the current source 119 117 and the input node 103. In this configuration, the bipolar junction transistor 119 furnishes enough remaining current for the constant current source 117 to sink depending on the amount of the signal current IS returned through the feedback resistor 111. For example, if no current is being returned through the feedback resistor 111, then the bipolar junction transistor 119 furnishes all the current that the constant current source 117 needs to sink. On the other hand, if a signal current IS is indeed being returned through the feedback resistor 111, then the bipolar junction transistor 119 furnishes the difference between the signal current IS and the amount of current the constant current source 117 is configured to sink.

Figure 5:
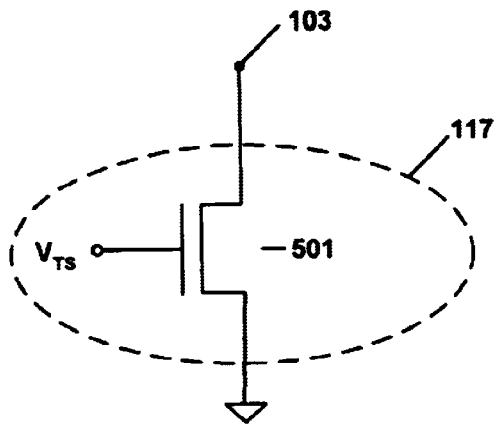
FIG. 5 depicts one implementation of a constant current source.

In one implementation illustrated in FIG. 5, the constant current source 117 comprises a field effect transistor (FET) 501 having a drain coupled to the input node 103 and a source coupled to ground. The gate of the field effect transistor is biased by a band gap circuit. The band gap circuit is configured to provides a suitable gate voltage (VGS) so that a constant current flows through the channel of the field effect transistor. In one arrangement, the field effect transistor operates in saturation mode and causes a saturation current IDSAT to pass through the channel of the field effect transistor from the input node 103 to ground. The saturation current IDSAT of a field effect transistor is proportional to the square of the potential difference between the gate and source. The bipolar junction transistor 119 also serves to fix voltage across the drain and source (VDS) to a constant value because the voltage at the emitter is VREF–VBE, where VREF is the reference voltage applied to the base of the bipolar junction transistor 119, and VBE is the threshold voltage across the base and the emitter of the bipolar junction transistor 119.

To provide a balanced circuit, the current source 117 and the bipolar junction transistor 119 can be dimensioned to provide a parasitic capacitance that matches the parasitic capacitance of the photodiode 115. Moreover, VREF is set so that the VDS=VREF–VBE is approximately equal to the voltage at input node 105 when photodiode 115 is producing a signal current IS.

Figure 2:
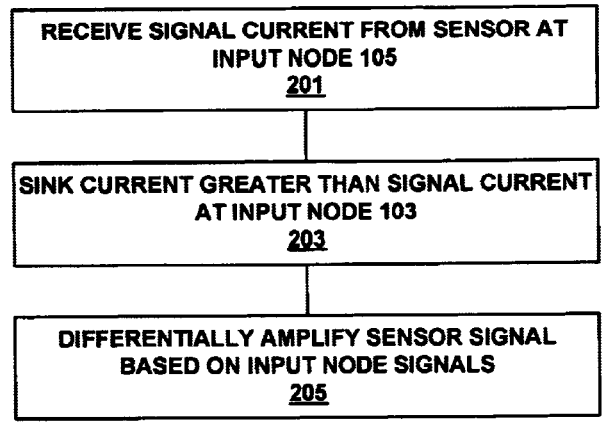
FIG. 2 is a flowchart illustrating the operation of the preamplifier depicted in FIG. 1.

FIG. 2 illustrates the operation of the circuit 110, in which, at step 201, the emission of light onto the photodiode 115 causes the photodiode to produce a signal current IS. Almost all of the signal current IS flows from the input node 105 through feedback resistor 113 to the output node 109, because of the negligible leakage current through the input 105 of the amplifier 101. Because the current source 117 provides a current sink path of a current at least as much as the signal current IS, the signal current IS also flows back from the output node 107 through feedback resistor 111 to the input node 103. This signal current IS is then sunk to ground through the current source 117 (step 203).

Figure 4:
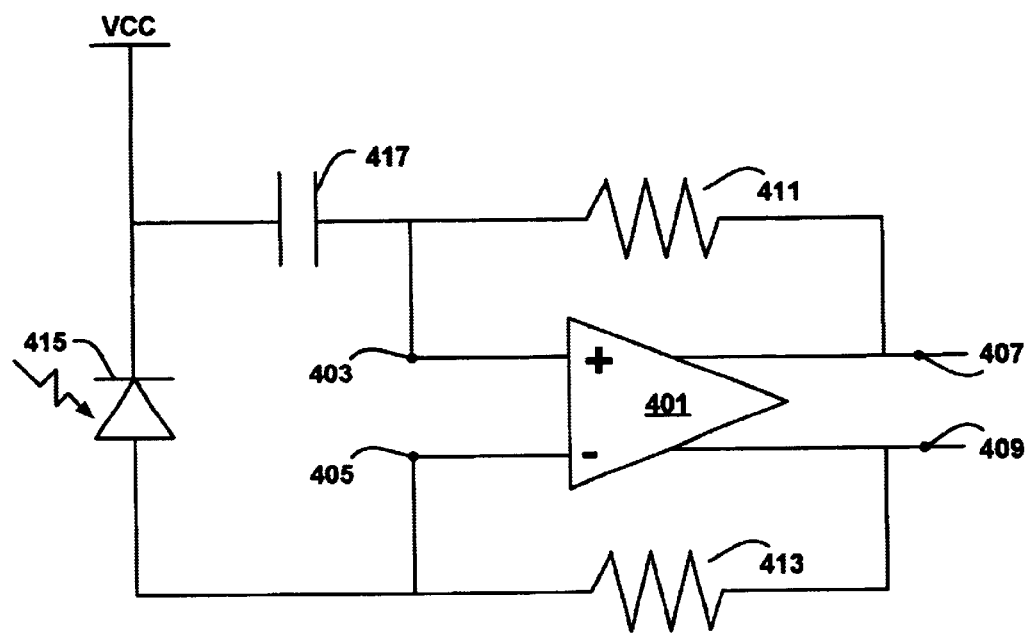
FIG. 4 depicts a low-gain differential preamplifier.

Meanwhile, the differential amplifier 101 amplifies the signal produced from the photodiode 115 based on signals at the input nodes 103 and 105 to produce a positive output voltage +DV at the output node 109 and a negative output voltage –DV at the output node 107 (step 205). Because the signal current IS is flowing through both feedback resistors 111 and 113, both the output nodes 107 and 109 swing by a full DV. Thus, 2 DV=IS×2 RF, or DV=IS×RF. Since the single-ended swing is RF, the differential transimpedance gain is 2 RF, which is twice the transimpedance gain of the circuit 400 depicted in FIG. 4. Thus, circuit 100 has increased responsivity to the sensor signal due to its higher gain.

Unlike circuit 400, circuit 100 does not incur a bandwidth penalty because the overall RC constant circuit 100 can be controlled to be approximately the same as that of circuit 400. For example, the current source 117 and the bipolar junction transistor 119 can be dimensioned to balance the capacitance of the photodiode 115, thereby playing the same role as the balancing capacitor 417 of the circuit 400. Furthermore, by selecting the signal current IS through the current source 117 and the bipolar junction transistor 119, circuit 100 has a high dynamic range. Thus, the combination of high bandwidth and dynamic range enables the use of circuit 100 in gigahertz (GHz) applications.

The size of the current source 117 and bipolar junction transmitter 119 can be quite small, about the same size as the capacitor 417. In one implementation, for example, the current source 117 is the size of a single field effect transistor. Thus, minimal area penalty is incurred for the circuit 110. Although the current source 117 and bipolar junction transmitter 119 are active components and, hence, consume power, the overall power requirements of the circuit 100 need not be much greater with respect to circuit 400. The reduced power requirement stems from the fact that the amplifier 101 can be scaled to consume less power than amplifier 401 due to the doubled transimpedance gain of circuit 100.

Accordingly, a high-speed preamplifier circuit is described that produces twice the transimpedance gain without incurring a significant penalty in terms power, area, bandwidth, sensitivity, or dynamic range. The improved gain is accomplished by providing a current source at an input of the differential amplifier, which creates a sink path for the signal path through the second feedback resistor.

Figure 3:
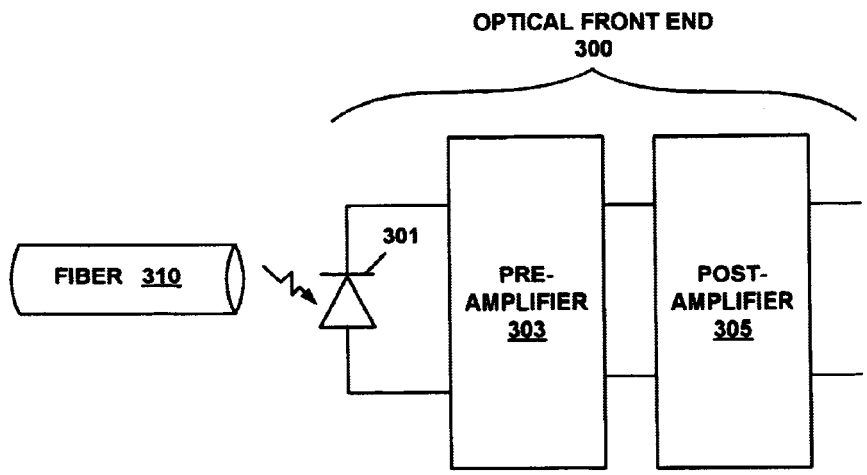
FIG. 3 depicts an optical front end in accordance with an embodiment.

Circuit 100 is particularly useful and advantageous in systems where high integration is needed by employing a preamplifier to noisy circuits such as serializer/deserializer circuits, post-amplifiers, and transimpendance amplifiers used in optical links. For example, FIG. 3 depicts the use of circuit 100 as a differential preamplifier 303 in an optical front end 300 that converts pulses of light or other optical signals from optical fiber 310 into electrical signal. More specifically, the optical front end 300 includes a coupled as an input to a differential preamplifier 303, which has outputs coupled to inputs of a post-amplifier 305. In this optical front end application, the photodiode 301 produces a current in response to light from the optical fiber 310. The differential preamplifier 303 amplifies and converts the current into a differential voltage with suitable impedances and gain so that the output signal can be firer processed by post-amplifier 305 without appreciable degradation in the signal-to-noise ratio.

While the present invention has been described in connection with a number of embodiments and implementations, the present invention is not so limited but covers various obvious modifications and equivalent arrangements, which fall within the purview of the appended claims.

For example, the photodiode 115 can be replaced by any optical sensor such as a photoresistor or photocell or any sensor that produces an electrical current in response to a physical stimulus, such as a piezoelectric crystal. The amplifier 101 can be implemented by an operational amplifier or by transistors whose emitters are coupled together. The current source 117 need not produce a constant current and can be implemented with an operational amplifier.

What is claimed is:

1. A circuit for amplifying a signal from a sensor, comprising:
   a current source;
   a differential amplifier having a first input coupled to the sensor and a second input coupled to the current source;
   a first feedback resistor coupled to the sensor and to a first output of the differential amplifier;
   a second feedback resistor coupled to the current source and to a second output of the differential amplifier; and
   wherein the current source is configured to sink a current from the second input to ground.

2. A circuit according to claim 1, wherein a gain of the circuit is approximately twice a sum of resistances of the first feedback resistor and the second feedback.

3. A circuit according to claim 1, wherein the current sunk by the current source is greater than a current produced by the sensor.

4. A circuit according to claim 1, wherein the current source includes a field effect transistor coupled between the second input and ground and configured to operate in saturation mode.

5. A circuit according to claim 4, further comprising a bipolar junction transistor having an emitter coupled to the second input and the current source.

6. A circuit for amplifying a signal from a sensor, comprising:
   a current source;
   a differential amplifier having a first input coupled to the sensor and a second input coupled to the current source;
   a first feedback resistor coupled to the sensor and to a first output of the differential amplifier;
   a second feedback resistor coupled to the current source and to a second output of the differential amplifier; and
   a bipolar junction transistor having an emitter coupled to the second input and a base coupled to a reference voltage, whereby a voltage at the second input is fixed.

7. A circuit according to claim 1, wherein the sensor comprises a photodiode.

8. A circuit according to claim 1, further comprising a post-amplifier having inputs coupled to the outputs of the differential amplifier.

9. A method of amplifying a signal from a sensor, comprising:
   receiving, at a first node, a current generated by the sensor;
   sinking, from a second node to ground, a current greater than the current generated by the sensor;
   providing a first feedback resistance between the first node and a first output of said differential amplifying;
   providing a second feedback resistance between the second node and a second output of the differential amplifying; and
   differentially amplifying the signal based on signals at the first node and the second node.

10. A method according to claim 9, wherein a gain of said differential amplifying is approximately twice a sum of the first feedback resistance and the second feedback resistance.

11. An optical front-end, comprising:
    a photodiode, responsive to light borne by an optical link;
    a differential amplifier having a first input coupled to the photodiode and a second input coupled to a constant current source;
    a first feedback resistor coupled to the photodiode and to a first output of the differential amplifier; and
    a second feedback resistor coupled to the constant current source and to a second output of the differential amplifier; and
    a bipolar junction transistor having a collector coupled to a supply voltage and an emitter coupled to the second input.

12. An optical front-end according to claim 11, wherein the constant current source includes a field effect transistor coupled between the second input and ground and configured to operate in saturation mode.

13. An optical front-end according to claim 11, wherein the bipolar junction transistor is configured to fix a potential to the second input at a constant value.

14. An optical front-end according to claim 11, wherein a gain of the differential amplifier is approximately twice a sum of resistances of the first feedback resistor and the second feedback resistor.

15. An optical front-end according to claim 11, wherein the current sunk by the constant current source is greater than a current produced by the sensor.

* * * * *